(12) United States Patent
Albiez (10) Patent No.: US 7,888,643 B2
(45) Date of Patent: Feb. 15, 2011

(54) FOCUSING AND POSITIONING DEVICE FOR A PARTICLE-OPTICAL RASTER MICROSCOPE

(75) Inventor: Michael Albiez, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 167 days.

(21) Appl. No.: 12/222,087

(22) Filed: Aug. 1, 2008

(65) Prior Publication Data

US 2008/0315120 A1 Dec. 25, 2008

Related U.S. Application Data

(63) Continuation of application No. PCT/EP2007/000759, filed on Jan. 30, 2007.

(30) Foreign Application Priority Data

Feb. 3, 2006 (DE) .................. 10 2006 004 950

(51) Int. Cl.
*G01N 23/00* (2006.01)
(52) U.S. Cl. .............. 250/310; 250/306; 250/307; 250/311; 250/442.11; 356/614; 356/615; 356/620; 356/622; 356/623
(58) Field of Classification Search ........... 250/306, 250/307, 310, 311, 442.11; 356/614, 615, 356/620, 622, 623
See application file for complete search history.

(56) References Cited

U.S. PATENT DOCUMENTS

| | | | | |
|---|---|---|---|---|
| 4,990,776 A | * | 2/1991 | Fushimi et al. | 250/310 |
| 5,025,165 A | * | 6/1991 | Chen et al. | 250/491.1 |
| 5,216,235 A | * | 6/1993 | Lin | 250/201.6 |
| 5,598,002 A | * | 1/1997 | Todokoro et al. | 250/310 |
| 5,614,713 A | * | 3/1997 | Kobaru et al. | 250/310 |
| 6,621,082 B2 | * | 9/2003 | Morita et al. | 850/5 |
| 6,714,289 B2 | | 3/2004 | Haraguchi | |
| 2002/0190207 A1 | * | 12/2002 | Levy et al. | 250/306 |
| 2003/0006372 A1 | * | 1/2003 | Morita et al. | 250/310 |
| 2003/0025087 A1 | * | 2/2003 | Schamber et al. | 250/491.1 |
| 2004/0211919 A1 | * | 10/2004 | Tanaka et al. | 250/491.1 |

FOREIGN PATENT DOCUMENTS

EP 0 849 765 6/1998

(Continued)

*Primary Examiner*—Bernard E Souw
*Assistant Examiner*—Michael Maskell
(74) *Attorney, Agent, or Firm*—Walter Ottesen (57) ABSTRACT

The invention relates to a focusing and positioning ancillary device for a particle-optical scanning microscope, a particle-optical scanning microscope including a corresponding positioning aid, and a method for focusing and positioning an object in a particle-optical scanning microscope. The focusing and positioning ancillary device includes an illuminating device, a camera, a display and a control unit. The illuminating device produces a collimated or focused light beam at an angle to the particle-optical beam axis which intersects the particle-optical beam axis at a predetermined position. The camera is sensitive to the wavelength of the light beam and records an image of the object, which is positioned on the object table, at a second angle to the particle-optical beam axis. The control unit produces an image captured by the camera on the display together with a marking which indicates the position of the particle-optical beam axis in the image.

17 Claims, 4 Drawing Sheets

FOREIGN PATENT DOCUMENTS

| | | |
|---|---|---|
| JP | 63-254649 | 10/1988 |
| JP | 3-141544 | 6/1991 |
| JP | 2000-180391 | 6/2000 |
| JP | 2004-319518 | 11/2004 |
| JP | 2004319518 | * 11/2004 |

* cited by examiner

FOCUSING AND POSITIONING DEVICE FOR A PARTICLE-OPTICAL RASTER MICROSCOPE

CROSS REFERENCE TO RELATED APPLICATIONS

This application is a continuation application of international patent application PCT/EP 2007/000759, filed Jan. 30, 2007, designating the United States and claiming priority from German application 10 2006 004 950.0, filed Feb. 3, 2006, and the entire content of both applications is incorporated herein by reference.

FIELD OF THE INVENTION

The invention relates to a focusing and positioning device for a particle-optical raster microscope and a particle-optical raster microscope having a corresponding focusing and positioning assist as well as a method for focusing and positioning an object in a particle-optical raster microscope.

BACKGROUND OF THE INVENTION

In raster electron microscopes and other particle-optical raster apparatus, the positioning of the object takes place relative to the particle-optical or electron-optical beam axis with the aid of the object table which is adjustable in three mutually perpendicular directions. A CCD camera having a camera illumination serves for viewing the object during the positioning. The camera illumination is often infrared. The optic of the CCD camera has a very high depth of focus. For this reason, it is hardly possible to position the object in the direction of the optical axis of the CCD camera with an accuracy of better than approximately 5 mm. With a subsequent switchover to electron irradiation or particle-optical irradiation and a recordation of an image of the object with the aid of the secondary particles, which are released by particle radiation, it can happen that even for an adjusted low magnification, the desired object detail is not seen in the image. This is so because the region, which is scanned by the particle beam, is smaller than the positioning accuracy in the image of the CCD camera and therefore the object region of interest still lies outside of the region scanned by the particle beam. The above-mentioned secondary particles are, for example, backscattered electrons or secondary electrons or light quanta which are released from the object itself or arise from the interaction of backscattered electrons or secondary electrons with gas molecules in the chamber.

Furthermore, the CCD camera image functions also for positioning the object in the direction of the particle beam axis, that is, for bringing the object plane into the plane defined by the work distance of the particle-optical objective. For an inexperienced user, this is likewise possible only with an accuracy of a few millimeters which is often not sufficient for a particle-optical image focused also only coarsely. For this reason, it is often necessary to seek the desired position on the object as well as to adjust the object to the correct work distance under particle-optical irradiation and the position sensitivity which occurs thereby.

In JP 63254649, it has already been suggested to provide, in addition, an optical microscope in a raster electron microscope and, with the laser beam thereof, to generate an ancillary signal for the generation of an autofocus signal for the electron optic.

Further relevant state of the art for the present invention includes: JP 2004-4319518, JP 10352776, JP 03141544, U.S. Pat. No. 6,714,289 and U.S. patent application publication US 2003/0006372.

SUMMARY OF THE INVENTION

It is an object of the invention to provide a focusing and positioning ancillary device for a particle-optical raster microscope which is simply configured and which facilitates the adjustment of the object to the work distance of the particle-optical objective and also facilitates the positioning of an object detail of interest perpendicular to the particle-optical axis of the raster microscope.

It is a further object of the invention to provide a particle raster microscope wherein the adjustment of an object to the work distance of the particle-optical objective is facilitated and the positioning of an object detail of interest perpendicularly to the particle-optical axis of the raster microscope is facilitated.

Still another object of the invention is to provide a method for a simpler and reliable adjustment of an object to the work distance of the particle-optical objective and to provide a simpler and reliable positioning of an object detail of interest perpendicular to the particle-optical axis of a raster microscope.

A focusing and positioning ancillary device for a particle-optical raster microscope includes an illuminating unit which generates a collimated or focused light beam at a first angle to the particle-optical beam axis and this beam intersects the particle-optical beam axis of the raster microscope at a predefined position. The focusing and positioning ancillary device further includes a camera with which an image of an object, which is positioned on the object table, is recorded at a second angle relative to the particle-optical beam axis with the camera being sensitive to the wavelength of the light beam. Furthermore, a display and a control unit are provided for generating an image, which is recorded by the camera, on the display together with a marking which shows the position of the particle-optical beam axis in the image.

A particle beam system of the invention includes a particle-beam generator, an objective lens, a specimen chamber and an object table mounted in the specimen chamber. Furthermore, a focusing and positioning unit is provided which generates a collimated or focused light beam at a first angle to the particle-optical beam axis which intercepts the particle-optical beam axis of the raster microscope at a predefined position. The focusing and positioning ancillary device further includes a camera, which is sensitive to the wavelength of the light beam, with which an image of an object, which is positioned on the object table, is recorded at a second angle relative to the particle-optical beam axis. Furthermore, a display and a control unit are provided for generating an image, which is recorded by the camera, on the display together with a marking which indicates the position of the particle-optical beam axis.

A method for focusing and positioning an object in a particle-optical raster microscope according to the invention takes place with the following steps:

a) making available a light beam which intersects the particle-optical beam axis of the objective at a pregiven position;

b) providing a camera which is sensitive to the wavelength of the light beam;

c) providing a display on which the position of the particle-optical beam axis of the objective is marked;

d) recording an image of an object, which is positioned on the object table, with the camera;

e) positioning the object table in the direction of the particle-optical beam axis of the objective until the light beam intercepts the object on the marking in the image of the object shown on the display; and, f) switching over the particle-optical raster microscope to irradiate the object with electrons and display an image of the object utilizing detected particles or light quanta which are generated by irradiation of the object with charged particles.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
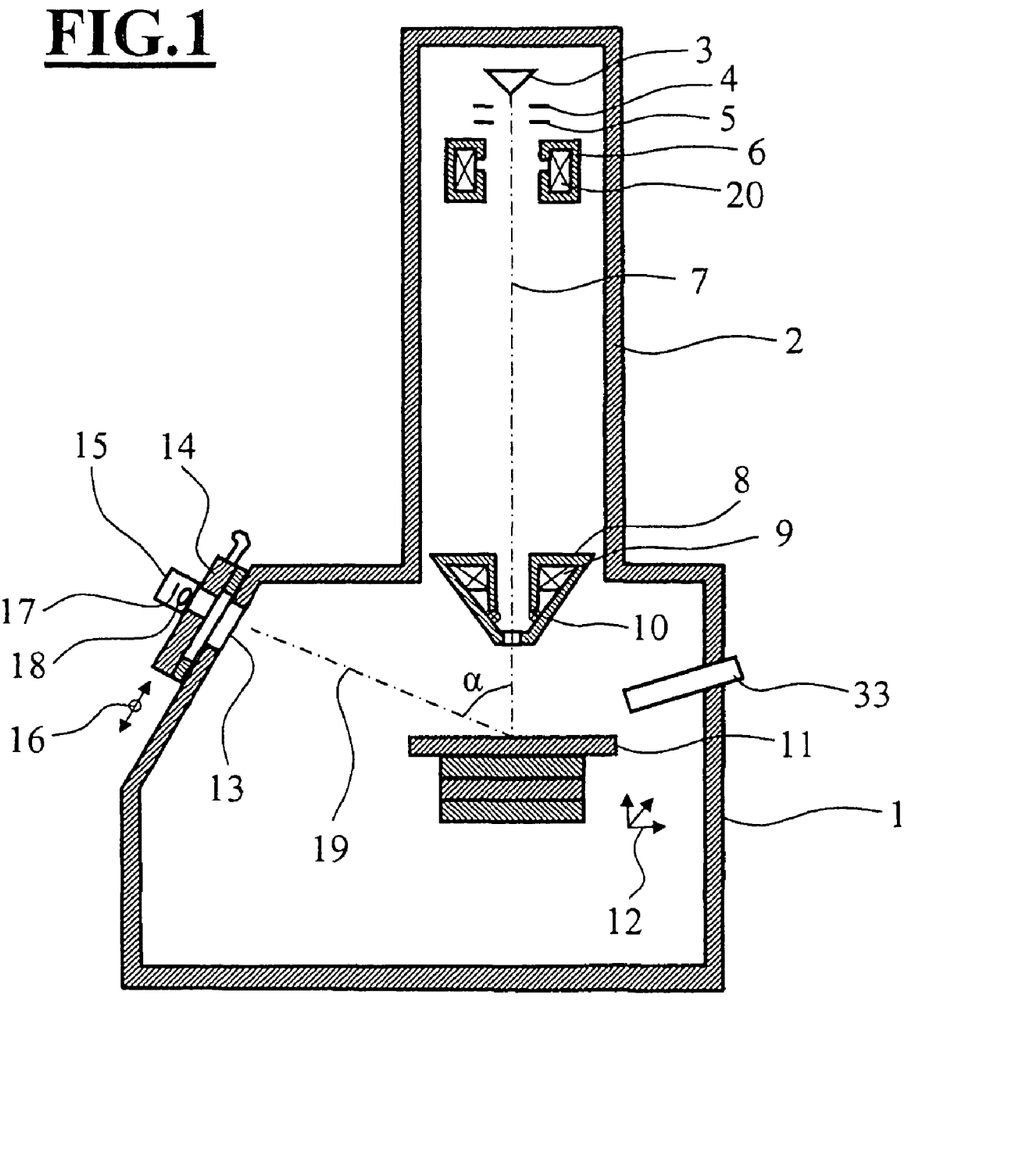
FIG. 1 shows a section view of a raster electron microscope having a focusing and positioning ancillary device.

The raster electron microscope in FIG. 1 includes a specimen chamber 1 and the electron-optical column 2 disposed thereon. The elements necessary for the beam formation of the beam of charged particles are accommodated in the electron-optical column 2. The following is provided for generating the particle beam: a particle emitter 3, for example, in the form of a thermal electron source, a LAB6 emitter or a thermal or cold field-emission source. The charged particles are extracted from the emitter 3 via electrodes (4, 5) to which a corresponding electrostatic potential is applied and these charged particles are accelerated to the desired target energy of the particle beam. If the particles of the particle beam are negatively charged, as, for example, with electrons, the electrostatic potentials of the electrodes (4, 5) are positive compared to the electrostatic potential of the emitter 3. If, in contrast, the particles of the particle beam are charged positive as, for example, with positrons or ions, the electrostatic potentials of the electrodes (4, 5) are negative compared to the electrostatic potential of the emitter 3.

The beam formation of the particle beam takes place via a condenser lens 6 and an objective lens 8. In the embodiment shown, the condenser lens 6 as well as the objective lens 8 are configured as magnetic lenses and, for this reason, they are shown as magnetic pole pieces having magnetic coils (9, 20) accommodated therein. The condenser lens 6 as well as the objective lens 8 can, however, also be configured as electrostatic lenses. Furthermore, especially the objective lens 8 can also be configured as an electrostatic-magnetic combination lens which generates a magnetic field as well as an electrostatic field.

The beam deflection unit is mounted in or near the main plane of the objective lens 8. The beam deflecting unit is realized in the embodiment shown in FIG. 1 by deflection coils 10 which are mounted approximately at the elevation of the pole piece gap of the objective lens 8. With the aid of the beam deflecting unit, the particle beam, which is focused by the objective lens 8, can be deflected perpendicularly to the particle-optical beam axis 7 which is hereinafter referred to as optical axis 7. The optical axis 7 is defined by the rotational symmetry of the objective lens 8. The beam deflecting unit can also be configured as a so-called double deflecting system having two individual deflecting systems one following the other in the direction of the optical axis 7. Also, mounting the deflecting coils at the elevation of the pole piece gaps of the objective lens is not mandatory.

An object table 11 is accommodated in the specimen chamber 1. The object table 11 is displaceable in three mutually perpendicular directions via displacing units (not shown). The three directions are shown by the arrows 12 and the specimen table 11 can additionally be tilted about an axis perpendicular to the particle-optical axis 7.

A diode laser 15 is accommodated on a displacing unit 14 at a lateral opening 13 of the specimen chamber 1. The diode laser generates a collimated or focused light beam. The opening whereat the diode laser 15 is accommodated can be a flange opening. The diode laser comprises a laser diode 17 having an optic 18 mounted in front thereof which makes available a light beam along an axis 19. The optic 18, which is disposed forward of the laser diode, generates a focus of the laser beam at the location along the laser beam axis 19 whereat this laser beam intersects the particle-optical beam axis 7. The diode laser 15 is displaceable in both directions perpendicular to the laser beam axis 19 via the displacing unit 14.

The accommodation of the diode laser 15 on the specimen chamber 1 relative to the particle-optical column 2 is such that the planes, in which the beam axis 19 of the laser beam lies in dependence upon the positioning of the diode laser 15 by means of the displacing unit 14, always lie at an inclination angle ($\alpha$) to the particle-optical axis 7. This inclination angle ($\alpha$) is not equal to 0° and 90° and preferably lies in the range of 20° to 70°0. With the aid of the displacing unit 14, the beam axis 19 of the diode laser is then so adjusted that the beam axis 19 of the laser beam intersects the particle-optical axis 7 at a predefined position.

Figure 2:
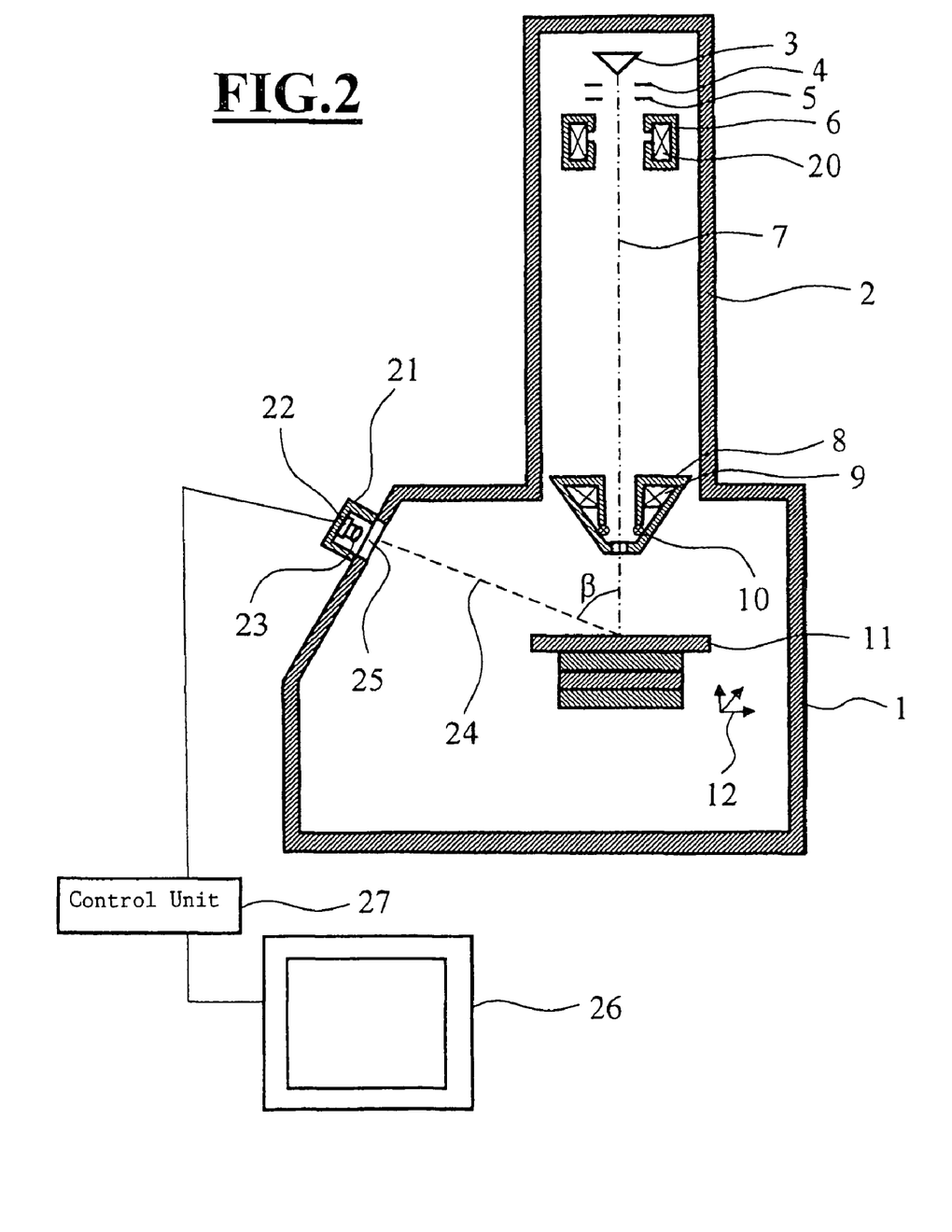
FIG. 2 shows a section view of the raster electron microscope of FIG. 1 viewed in a plane perpendicular to FIG. 1.

As shown in the section view in FIG. 2 taken perpendicular to FIG. 1, a camera module 21 is mounted on a further flange opening 25 of the specimen chamber 1. The camera module 21 has a camera chip 22, for example, a CCD-chip sensitive to infrared light, and a camera objective 23. The camera chip 22 is also sensitive to the wavelength of the diode laser 15. The optical axis 24 of the camera module is likewise inclined at an angle ($\beta$) to the particle-optical axis 7. The inclination angle ($\beta$) of the camera module 21 can deviate from the inclination angle ($\alpha$) of the diode laser 15 but need not do so. The inclination angle ($\beta$) of the camera module 21 is so selected that the surface of the object table 11 can be viewed inclined from above with the camera chip 22 and, accordingly, an inclined view onto the object table 11 and an object disposed thereon can be displayed on a monitor or display 26.

Furthermore, a camera illumination (not shown) is provided via which the region around the object table is illuminated with light of a wavelength to which the camera chip 22 is sensitive.

The output signals of the camera module 21 are first supplied to a control unit 27 via which further information can be superposed on the images recorded with the camera chip 22 so that correspondingly superposed images can be shown on the monitor 26. With the control unit 27, especially a marking in a form of a line is generated which indicates the position of the particle-optical axis 7 in the image recorded with the camera chip 22. The extension of the marking is greater in the direction of the particle-optical axis than perpendicular to the particle-optical axis 7.

Figure 3:
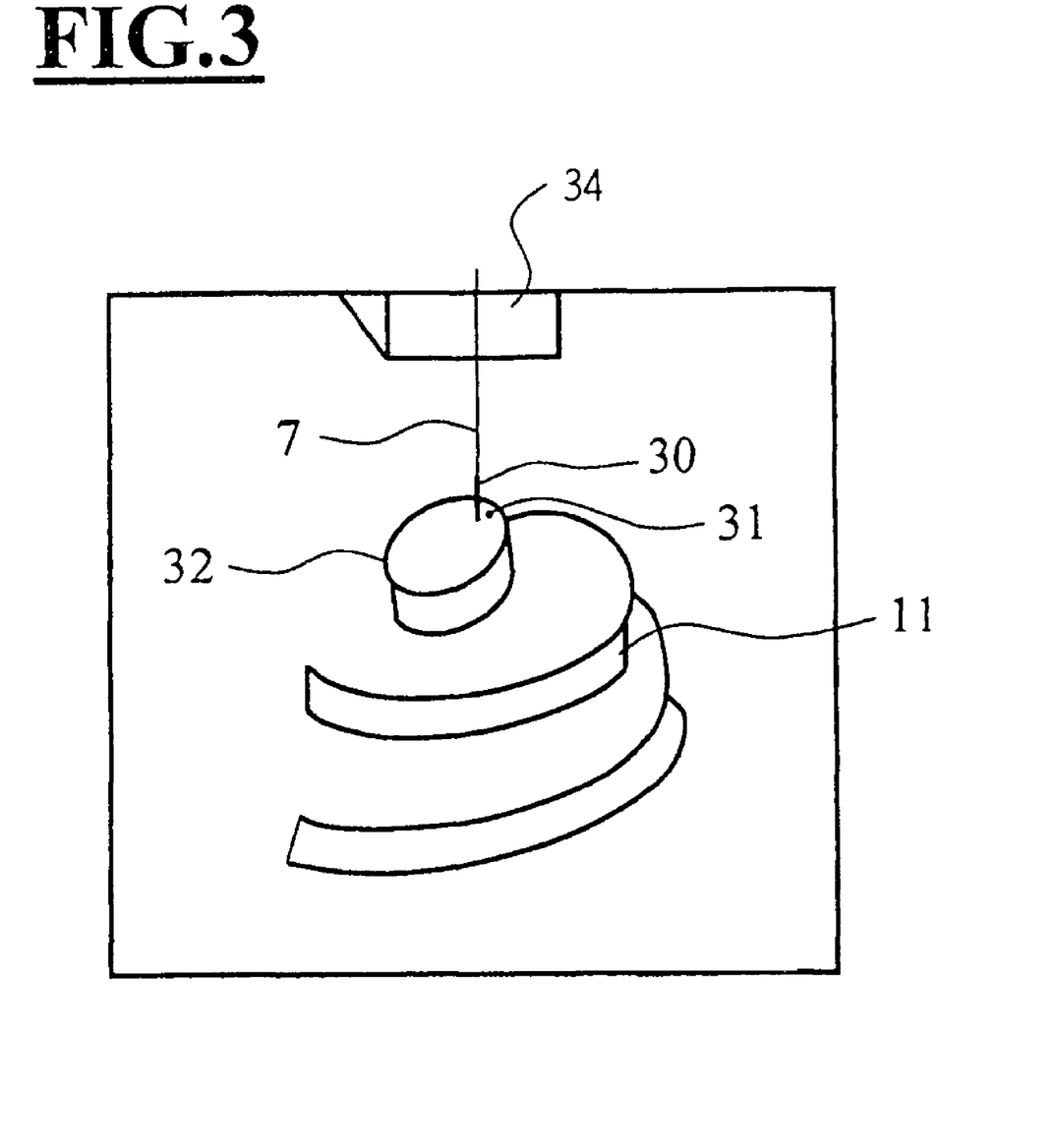
FIG. 3 shows a camera image of an object with a superposed marking.
Figure 4:
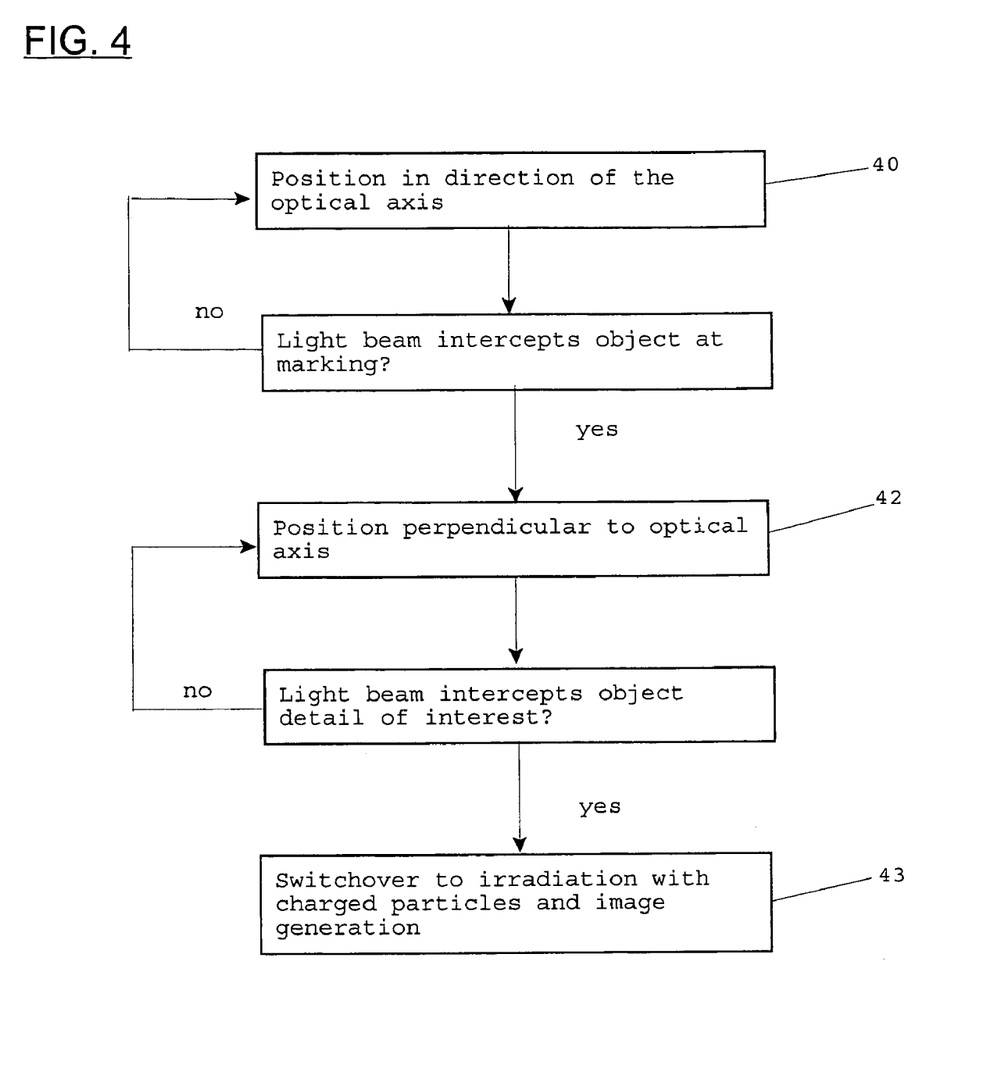
FIG. 4 is a block diagram showing the method steps in the focusing and positioning method of the invention.

The positioning of the object then takes place with the aid of the system of the invention according to the method shown as a block diagram in FIG. 4. The image recorded with the camera chip 22 is shown on the monitor 26 with the superposed marking which indicates the position of the particle-optical axis 7. First, in this image of the object, the incident point of the light beam, which is generated by the laser module 15, on the object or the object table is sought. A corresponding superposed image of an object 32, which is accommodated on the object table 11, is shown in FIG. 3. In the image, the lower region 34 of the pole piece of the objective lens 8 can be seen next to the object table 11. Furthermore, the incident point 31 of the laser beam on the object table can likewise be seen as well as the marking 30 which indicates, as annotation, the position of the particle-optical axis 7.

The offset between the incident point 31 of the laser beam and the marking 30 indicates that the surface of the object 32 is not yet located at the wanted work distance along the particle-optical axis 7. Accordingly, and in a first step 40, the object table 11 is shifted in the direction of the optical axis with the aid of the drive of the object table until the incident point 31 of the laser beam lies on the marking 30 which indicates the position of the particle-optical axis. When this has taken place, the object is then shifted perpendicularly to the particle-optical axis 7 with the aid of the other drives of the object table 11 until the marking 30 lies in the region of an object detail of interest in the optical image recorded with the camera chip 22.

When, with this movement perpendicular to the particle-optical axis, the position of the incident point 31 of the laser beam moves away from the marking, then the first step 40 is repeated once more and the object table is moved in the direction of the particle-optical axis 7 until the incident point 31 of the laser beam is again coincident with the marking. A moving apart of the incident point of the laser beam from the marking can especially take place when the surface of the object does not lie perpendicularly to the particle-optical axis 7.

Step 43 follows only after the positioning described above in the direction of the particle-optical axis and navigation perpendicular to the particle-optical axis has taken place, that is, the marking 30 in the superposed image, which is recorded by the camera chip 22, is coincident with an object detail of interest and the incident point 31 of the laser beam lies on the object surface on the marking 30. In step 43, the switchover to particle-optical microscopy takes place in that signals are detected by a detector 33 and are used for image generation which arises via irradiation of the object with the primary particles. Secondary particles of this kind released via particle irradiation can be backscattered electrons, secondary electrons or light quanta which either are triggered by the object itself or arise because of an interaction of backscattered electrons or secondary electrons with gas molecules in the specimen chamber.

A first adjustment of the system can take place with the aid of the object which has a pronounced location, for example, an acute angle edge. Under particle irradiation, this location is first located and, by displacing the object table, this pronounced location is so moved in the direction of the particle-optical axis 7 until this pronounced object location is disposed at the desired work distance in the direction of the particle-optical axis, for example, in that the signals, which are generated with the particle beam, show the maximum lateral resolution. Thereafter, the diode laser 15 is so positioned with the aid of the displacing unit that, in the image, which is recorded with the camera chip 22, the light beam incidents precisely at the pronounced object location on the object. In the last step, a line is provided as marking in the video image with the aid of the control unit 27 and this marking runs through the pronounced location and runs in the direction toward the center of the objective lens. The installed marking is then stored as a reference and later is available when objects with less pertinent object details are to be microscoped. The marking can be generated in an especially simple manner when the camera chip 22 is accommodated on the specimen chamber to be so orientated that the vertical direction in the image, which is recorded on the camera chip, is coincident with the direction of the particle-optical axis. The marking 30 then simply is the image gap or the portion of the image gap in the image wherein the pronounced object location lies.

In this connection, it is noted that the intersect point of the light beam with the particle-optical axis can be adjusted to any work distance wanted by the customer, that is, to any position along the particle-optical axis which is desirable in practice.

The current supply of the diode laser can be varied via a variable current source or a resistance potentiometer so that the brightness of the laser beam is variable and can thereby be adapted to the instantaneous brightness conditions and possibly a different reflection behavior of the object for the light of the laser beam and the IR light of the chamber illumination. As required, the brightness control of the diode laser can also take place by software supported automation.

Most raster electron microscopes already have a chamber illumination (often infrared) and a camera with which an image of the object table can be recorded. For this reason, an ancillary module according to the invention can be easily retrofitted on an already existing apparatus. All that is needed is that the laser module with the required displacing unit be accommodated on a free port of the specimen chamber. The in-coupling of the laser beam can take place via a glass plate which closes off the specimen chamber vacuum tight with respect to the ambient. Furthermore, and in the event that it is not anyway present, a video mixer unit is to be supplemented with which the wanted marking can be generated in the video image of the camera and can be stored.

In the embodiment described in FIGS. 1 and 2, the optical axis 24 of the camera module and the laser beam axis 19 are aligned perpendicular or almost perpendicular to each other. In this way, an especially clear displacement of the incident point of the laser focus results on the object in the image, which is recorded with the camera, in dependence upon a change of the position of the object table in the direction of the particle-optical axis. For this reason, the optical axis 24 of the camera module and the laser beam axis 19 should conjointly define an angle which clearly deviates from 0° and 180°, for example, lies in the range between 45° and 135°.

In the embodiment described in FIGS. 1 and 2, the illuminating unit is configured as a diode laser which generates a focused light beam. The illuminating unit can, however, also be realized in other ways, for example, by an incandescent lamp or an LED which, with the aid of an optic mounted forward thereof, generates a focused light beam whose focus ideally lies at the intersect point of the light beam and the particle-optical axis. Alternatively, and in lieu of a diode laser, a gas laser, a solid state laser, a fiber laser or a fiber-coupled light source can be used. Insofar as the beam, which is emitted by the laser or another light source, is adequately collimated (with a beam diameter of approximately 0.5 mm in the region whereat the light beam intercepts the particle-optical axis), no focusing ancillary optic would be necessary.

In lieu of coupling the laser beam in via a port from outside into the specimen chamber, the entire diode laser including the displacement device can be mounted within the specimen chamber.

Also, when utilizing a fiber-coupled light source, this light source can be mounted outside of the specimen chamber and the fiber can be guided into the specimen chamber. In this case, the exit end of the fiber would have to be accommodated on a displacing unit to be mounted within the specimen chamber.

In the embodiment described with respect to FIGS. 1 and 2, an infrared illumination is provided as a chamber illumination and a camera sensitive to IR is provided as the camera. The chamber illumination can, however, also have another wavelength and, correspondingly, the camera should then also be sensitive to another wavelength or another wavelength range. The diode laser too need not emit in the infrared spectral range but can, instead, have any desired wavelength. All that is required is that the camera be simultaneously sensitive to the camera illumination as well as to the light of the illuminating unit of the focusing and positioning ancillary device.

Insofar as the focusing and positioning ancillary device is to be universally utilized for specimen chambers of different sizes, it is purposeful when the position of the laser focus along the laser beam axis 19 can be varied via the optic 18. If, in contrast, the diode laser (for different specimen chambers), can always be mounted at virtually the same distance from the intercept point of the laser beam axis and the particle optical axis, then a diode laser having a fixed optic and a fixed position of the laser focus resulting therefrom along the laser beam axis can be used.

In the embodiment described with respect to FIGS. 1 and 2, the detector 33 for signals is mounted in the specimen chamber with the signals being generated by radiation of the object with primary particles. Alternatively, this detector can, however, also be mounted in the particle-optical column, for example, approximately in the region of the objective (so-called in-lens-detector) facing toward the particle source or one or several detectors can be mounted in the particle-optical column. The detector 33 for signals, which arise from irradiation of the object with primary particles, can, for example, be an Everhardt-Thornley-detector, an EDX-detector or a light detector or an electrode.

It is understood that the foregoing description is that of the preferred embodiments of the invention and that various changes and modifications may be made thereto without departing from the spirit and scope of the invention as defined in the appended claims.

What is claimed is:

1. A focusing and positioning ancillary device for a particle-optical raster microscope having an objective defining a particle-optical beam axis and an object table for accommodating an object thereon, the focusing and positioning ancillary device comprising:
   an illuminating unit configured to generate at least one of a collimated light beam and a focused light beam at a first angle to said particle-optical beam axis with said light beam having a wavelength and intercepting said particle-optical beam axis at a predefined position;
   a camera sensitive to said wavelength and configured to record an image of said object positioned on said object table at a second angle relative to said particle-optical beam axis;
   a display;
   a control unit configured to cause said image recorded by said camera to be shown on said display together with a line-shaped marking indicating the position of said particle-optical beam axis in said image; and,
   said line-shaped marking being displayed in said image on said display showing said line-shaped marking extending longer in length in the direction of said particle-optical axis than perpendicular to said particle-optical beam axis.

2. The focusing and positioning ancillary device of claim 1, wherein said illuminating unit comprises a laser.

3. The focusing and positioning ancillary device of claim 2, wherein said laser is a diode laser and said illuminating unit further includes an optic disposed in front of said laser diode.

4. The focusing and positioning ancillary device of claim 1, wherein said illuminating unit has a focus in the vicinity of the intersect point of said light beam with said particle-optical beam axis.

5. The focusing and positioning ancillary device of claim 1, wherein said light beam defines an axis along which said light beam travels; and, wherein said device further comprises a displacement unit accommodating said illuminating unit thereon for adjusting said axis of said light beam perpendicularly to the course thereof.

6. A particle beam system comprising:
   an objective lens defining a particle-optical beam axis;
   a particle beam generator for generating a particle beam for travel along said particle-optical beam axis;
   a specimen chamber;
   an object table for accommodating an object thereon and said object table being mounted in said specimen chamber;
   a focusing and positioning ancillary device including:
   an illuminating unit configured to generate at least one of a collimated light beam and a focused light beam at a first angle to said particle-optical beam axis with said light beam having a wavelength and intercepting said particle-optical beam axis at a predefined position;
   a camera sensitive to said wavelength and configured to record an image of said object positioned on said object table at a second angle relative to said particle-optical beam axis;
   a display;
   a control unit configured to cause said image recorded by said camera to be shown on said display together with a line-shaped marking indicating the position of said particle-optical beam axis in said image; and,
   said line-shaped marking being displayed in said image on said display showing said line-shaped marking extending longer in length in the direction of said particle-optical axis than perpendicular to said particle-optical beam axis.

7. The particle beam system of claim 6, wherein said illuminating unit comprises a laser.

8. The particle beam system of claim 7, wherein said laser is a diode laser and said illuminating unit further includes an optic disposed in front of said laser diode.

9. The particle beam system of claim 6, wherein said marking extends longer in length in the direction of said particle-optical beam axis than perpendicular to said particle-optical beam axis.

10. The particle beam system of claim 6, wherein said illuminating unit has a focus in the vicinity of the intersect point of said light beam with said particle-optical beam axis.

11. The particle beam system of claim 6, wherein said light beam defines an axis along which said light beam travels; and, wherein said device further comprises a displacement unit accommodating said illuminating unit thereon for adjusting said axis of said light beam perpendicularly to the course thereof.

12. A method of focusing and positioning an object in a particle-optical raster microscope including an objective defining a particle-optical beam axis and an object table, said method comprising the steps of:
- (a) providing a light beam having a predetermined wavelength and intersecting said particle-optical beam axis at a predefined position;
- (b) providing a camera sensitive to said wavelength;
- (c) providing a display whereon the position of said particle-optical beam axis is marked with a line-shaped marking;
- (d) recording an image of said object positioned on said object table via said camera;
- (e) positioning said object table in the direction of said particle-optical beam axis until said light beam intersects said object on said line-shaped marking in the image of said object shown on said display with said line-shaped marking extending longer in length in the direction of said particle-optical axis than perpendicular to said particle-optical beam axis; and,
- (f) switching over said particle-optical raster microscope for irradiation of said object with electrons and displaying an image of said object via detected particles or light quanta generated by said irradiation of said object with charged particles.

13. The method of claim 12, further comprising the additional step carried out between steps (e) and (f) of positioning said object table perpendicularly to said particle-optical beam axis until said light beam intersects a selected location of interest of said object in said image recorded by said camera and shown on said display.

14. The focusing and positioning ancillary device of claim 1, wherein the position of said line-shaped marking is determined in an adjusting process and stored as a reference.

15. The particle beam system of claim 6, wherein the position of said line-shaped marking is determined in an adjusting process and stored as a reference.

16. The method of claim 12, wherein the position of said line-shaped marking is determined in an adjusting process and stored as a reference.

17. The focusing and positioning ancillary device of claim 1, wherein said illuminating unit is a single and only illuminating unit of said device and said camera is a single and only camera of said device.

* * * * *